United States Patent
Hyun et al.

(10) Patent No.: US 7,679,960 B2
(45) Date of Patent: Mar. 16, 2010

(54) NON-VOLATILE MEMORY DEVICE AND METHOD OF OPERATING THE SAME

(75) Inventors: Jae-woong Hyun, Uijeongbu-si (KR);
Kyu-charn Park, Pyeongtaek-si (KR);
Yoon-dong Park, Yongin-si (KR);
Won-joo Kim, Hwaseong-si (KR);
Young-gu Jin, Hwaseong-si (KR);
Suk-pil Kim, Yongin-si (KR);
Kyoung-Iae Cho, Yongin-si (KR);
Jung-hoon Lee, Seoul (KR);
Seung-hwan Song, Incheon (KR)

(73) Assignee: Samsung Elecronics Co., Ltd., Gyeonggi-do (KR)

( * ) Notice: Subject to any disclaimer, the term of this patent is extended or adjusted under 35 U.S.C. 154(b) by 136 days.

(21) Appl. No.: 11/980,358

(22) Filed: Oct. 31, 2007

(65) Prior Publication Data
US 2008/0151631 A1 Jun. 26, 2008

(30) Foreign Application Priority Data
Dec. 22, 2006 (KR) .................. 10-2006-0133093

(51) Int. Cl.
*G11C 16/04* (2006.01)
(52) U.S. Cl. .................. 365/185.18; 365/185.05; 257/314
(58) Field of Classification Search ............ 365/185.18, 365/185.05; 257/314
See application file for complete search history.

(56) References Cited

U.S. PATENT DOCUMENTS

| 6,475,872 | B1 | 11/2002 | Jung | |
|---|---|---|---|---|
| 7,317,639 | B2 * | 1/2008 | Choi | ............ 365/185.18 |
| 2004/0080991 | A1 | 4/2004 | Sawasaki | |
| 2006/0197111 | A1 | 9/2006 | Matsuzawa | |
| 2006/0278913 | A1 | 12/2006 | Mihnea et al. | |

FOREIGN PATENT DOCUMENTS

JP          1994-208796      7/1994

OTHER PUBLICATIONS

European Search Report dated Apr. 4, 2008 for corresponding European Application No. 07122917.3-1235.
Chinese Office Action dated Jun. 6, 2008 and English Translation of Office Action—Application No. 2005101068619.

* cited by examiner

*Primary Examiner*—Huan Hoang
(74) *Attorney, Agent, or Firm*—Harness, Dickey & Pierce, P.L.C.

(57) ABSTRACT

A highly integrated non-volatile memory device and a method of operating the non-volatile memory device are provided. The non-volatile memory device includes a semiconductor layer. A plurality of upper control gate electrodes are arranged above the semiconductor layer. A plurality of lower control gate electrodes are arranged below the semiconductor layer, and the plurality of upper control gate electrodes and the plurality of lower control gate electrodes are disposed alternately. A plurality of upper charge storage layers are interposed between the semiconductor layer and the upper control gate electrodes. A plurality of lower charge storage layers are interposed between the semiconductor layer and the lower control gate electrodes.

22 Claims, 6 Drawing Sheets

NON-VOLATILE MEMORY DEVICE AND METHOD OF OPERATING THE SAME

PRIORITY STATEMENT

This application claims the benefit of Korean Patent Application No. 10-2006-0133093, filed on Dec. 22, 2006, in the Korean Intellectual Property Office, the disclosure of which is incorporated herein in its entirety by reference.

BACKGROUND

1. Field

Example embodiments relate to a semiconductor device. More specifically, example embodiments relate to a non-volatile memory device capable of storing data using charge storage layers and a method of operating the non-volatile memory device.

2. Description of the Related Art

In recent years, nonvolatile memory devices used in semiconductor products have been more highly integrated due to the trend toward miniaturization of semiconductor products. Accordingly, non-volatile memory devices having three dimensional structures have been introduced instead of conventional planar structures. Therefore, semiconductor substrates have been changing from conventional bulk wafer type structures to various three dimensional structures. For example, in a silicon-on-insulator (SOI) substrate, semiconductor layers may be disposed both on and under an insulation body.

However, there is a limit to which the degree of integration of a non-volatile memory device can be increased. In a conventional planar and/or a conventional three dimensional non-volatile memory device, a source and drain region still occupies a wide area. In particular, even in a conventional non-volatile memory device having a NAND structure, which is advantageous in the aspect of the degree of integration, a source and drain region occupies a wide area, thereby restricting an increase in the degree of integration.

SUMMARY

Example embodiments provide a highly integrated non-volatile memory device.

Example embodiments also provide a method of operating the non-volatile memory device.

An example embodiment of a non-volatile memory device that includes a semiconductor layer is provided. A plurality of upper control gate electrodes are arranged above the semiconductor layer. A plurality of lower control gate electrodes are arranged below the semiconductor layer, and the plurality of lower control gate electrodes and the plurality of upper control gate electrodes are disposed alternately. A plurality of upper charge storage layers are interposed between the semiconductor layer and the upper control gate electrodes. A plurality of lower charge storage layers are interposed between the semiconductor layer and the lower control gate electrodes.

According to an example embodiment, a non-volatile memory device may further include a string erase electrode electrically connected to the semiconductor layer.

According to an example embodiment, a non-volatile memory device may further include a string selection electrode and a source selection electrode formed above or below the semiconductor layer and arranged on both outer sides of the plurality of upper control gate electrodes and the plurality of lower control gate electrodes.

According to an example embodiment, a non-volatile memory device may further include a source and drain region defined in the semiconductor layer on both sides of the string selection electrode and the source selection electrode. The source and drain region may be defined at a portion of the semiconductor layer on the outer side of the upper control gate electrodes and the lower control gate electrodes.

Another example embodiment provides a non-volatile memory device that includes a plurality of semiconductor layers arranged in rows. A plurality of upper control gate electrodes are arranged in columns above the plurality of semiconductor layers. A plurality of lower control gate electrodes are arranged in columns below the plurality of semiconductor layers, and the plurality of lower control gate electrode and the plurality of upper control gate electrodes are disposed alternately. A plurality of upper charge storage layers are interposed between each of the plurality of semiconductor layers and the upper control gate electrodes. A plurality of lower charge storage layers are interposed between each of the plurality of semiconductor layers and the lower control gate electrodes.

Still another example embodiment provides a method of operating a non-volatile memory device. One of a plurality of upper or lower control gate electrodes is selected and data in one of the upper or lower charge storage layer below the selected upper or lower control gate electrode is programmed by applying a program voltage to the selected upper or lower control gate electrode. One of the plurality of upper or lower control gate electrodes is selected and the data of the upper or lower charge storage layer below the selected upper or lower control gate electrode is read by applying a read voltage to the selected upper or lower control gate electrode.

An example embodiment of a method may further include erasing the data of the upper and lower charge storage layers substantially simultaneously by applying an erase voltage to a string erase electrode electrically connected to the semiconductor layer.

BRIEF DESCRIPTION OF THE DRAWINGS

The above and other features, aspects and advantages of example embodiments will become more apparent from a review of the detailed description, which refers to the attached drawings in which.

DETAILED DESCRIPTION OF EXAMPLE EMBODIMENTS

Figure 1:
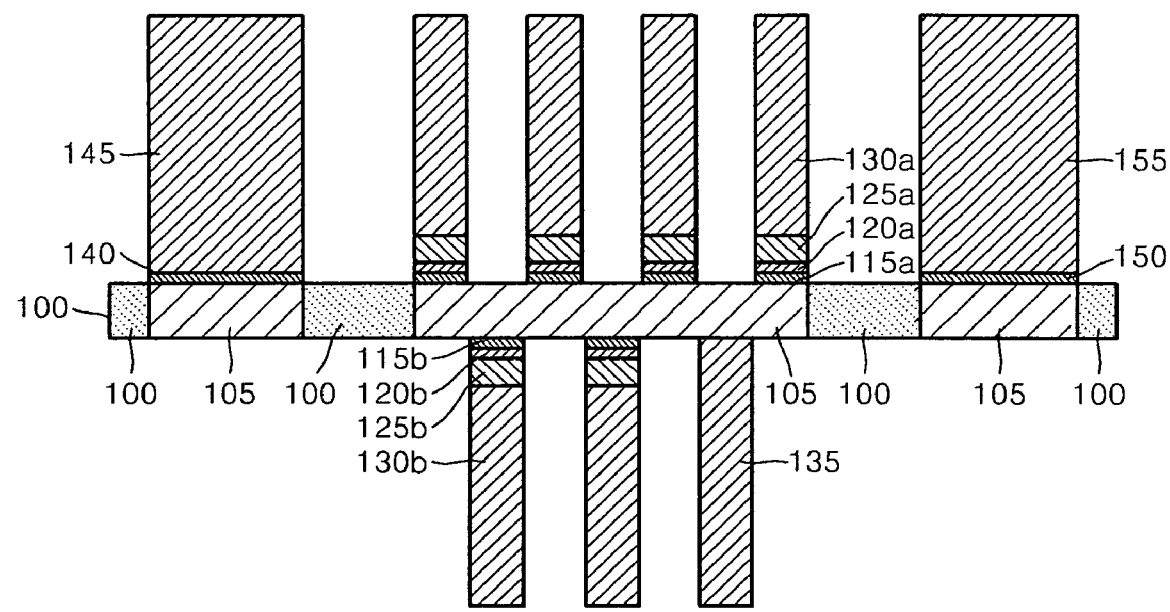
FIG. 1 is a cross-sectional view showing an example embodiment of a non-volatile memory device.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

FIG. 1 is a cross-sectional view showing an example embodiment of a non-volatile memory device.

Referring to FIG. 1, the non-volatile memory device includes a plurality of upper control gate electrodes 130a arranged above a semiconductor layer 100 and a plurality of lower control gate electrodes 130b arranged below a semiconductor layer 100. The semiconductor layer 100 may include a plurality of regions. The semiconductor layer 100 may include one or more first regions 105. A first region 105 corresponds to a region below or above the upper and lower control gate electrodes 130a and 130b, respectively. The first region 105 may be used as a channel region. The first region 105 of the semiconductor layer 100 may be a silicon layer or a silicon-germanium layer, for example. The semiconductor layer 100 may also include one or more second regions 110. The one or more second regions may correspond to source and/or drain regions. Alternatively, the one or more second regions 110 may be independent structures arranged on a substrate.

For example, the upper control gate electrodes 130a may be arranged in a NAND array above the semiconductor layer 105 and the lower control gate electrodes 130b may be arranged in another NAND array below the semiconductor layer 105. The upper control gate electrodes 130a and the lower control gate electrodes 130b may be disposed alternately. That is, the lower control gate electrodes 130b may be interposed between two adjacent upper control gate electrodes 130a. The number of the upper and lower control gate electrodes 130a and 130b may be selected as desired, and the number of the upper and lower gate electrodes 130a and 130b do not limit the scope of example embodiments.

The upper and lower control gate electrodes 130a and 130b may include conductive layers and may be separated from the semiconductor layer 100. For example, the upper and lower control gate electrodes 130a and 130b include conductive layers separated from a first region 105 of the semiconductor layer 100. The upper and lower control gate electrodes 130a and 130b may have various widths W. According to example embodiment shown in FIG. 1, the widths W of the upper and lower control gate electrodes 130a and 130b are the same. Moreover, the upper and lower control gate electrodes 130a and 130b may be separated from each other by various intervals D. According to example embodiment shown in FIG. 1, the intervals D are the same. Further, the separation interval D of the upper control gate electrodes 130a may be the same as the width W of the lower control gate electrodes 130 according to an example embodiment.

For example, assuming that the width W of the upper and lower control gate electrodes 130a and 130b is 1 F, the separation interval D may also be 1 F. Moreover, assuming that the width (in a direction perpendicular to the semiconductor layer 100 of FIG. 1) is 1 F, one unit including one of the upper control gate electrodes 130a and one of the lower control gate electrodes 130b has an area equal to 2 F×2 F, i.e., 4 $F^2$, on a plane (in the direction perpendicular to the semiconductor layer of FIG. 1).

However, in a modified example embodiment, the widths W and the separation intervals D of the upper and lower control gate electrodes 130a and 130b may be selected as desired. For example, the widths W and the separation intervals D of the upper and lower control gate electrodes 130a and 130b may not be the same. As another example, the width W of the lower control gate electrodes may be smaller than the separation distance D of the upper control gate electrodes 130a.

Still referring to FIG. 1, a plurality of upper charge storage layers 120a may be interposed between the upper control gate electrodes 130a and the first region 105 of the semiconductor layer 100, and a plurality of lower charge storage layers 120b may be interposed between the lower control gate electrodes 130b and the first region 105 of the semiconductor layer 100.

The upper and lower charge storage layers 120a and 120b may be used as floating gates or charge trapping layers. For example, the upper and lower charge storage layers 120a and 120b may include poly-silicon layers, nitride layers, quantum dots, and/or nano-crystals. The quantum dot or the nano-crystal may include nano-structures of a metal or silicon, for example.

In FIG. 1, a plurality of upper tunnelling insulation films 115a are interposed between the upper charge storage layers 120a and the first region 105 of the semiconductor layer 100, and a plurality of lower tunnelling insulation films 115b are interposed between the lower charge storage layers 120b and the first region 105 of the semiconductor layer 100. The upper and lower tunnelling insulation films 115a and 115b have thicknesses sufficient to allow tunnelling of charges. For example, the upper and lower tunnelling insulation films 115a and 115b may include oxide films, nitride films, and/or high dielectric constant films. The high dielectric constant film may refer to an insulation layer having a dielectric constant greater than those of an oxide film and a nitride film.

Still referring to FIG. 1, a plurality of upper blocking insulation films 125a are interposed between the upper charge storage layers 120a and the upper control gate electrodes 130a, and a plurality of lower blocking insulation films 125b are interposed between the lower charge storage layers 120b and the lower control gate electrodes 130b. The upper and lower blocking insulation films 125a and 125b may restrain charges of the upper and lower charge storage layers 120a and 120b from reversely tunnelling to the upper and lower control gate electrodes 130a and 130b. For example, the upper and lower blocking insulation films 125a and 125b may include oxide films, nitride films, and/or a high dielectric constant film.

A string erase electrode 135 may be electrically connected to the first region 105 of the semiconductor layer 100. In FIG. 1, the first region 105 of the semiconductor layer 100 forms one string. The string erase electrode 135 is used to effectively apply an electrical signal, e.g., a voltage, to the first region 105 of the semiconductor layer 100. For example, the string erase electrode 135 may be used to remove the charges stored in the upper and lower charge storage layers 120a and 120b, which will be described later. The string erase electrode 135 may include a conductive layer, e.g., polysilicon or a metal.

For example, the string erase electrode 135 may be electrically connected to a first region 105 of the semiconductor layer 100 on the outermost side of the lower control gate electrodes 130b. However, in a modified example, the string erase electrode 135 may be electrically connected to a first region 105 of the semiconductor layer 100 on the outermost side of the upper control gate electrodes 130a. Moreover, in another modified example, the string erase electrode 135 may be electrically connected to a first region of the semiconductor layer 100 between the upper control gate electrodes 130a or the lower control gate electrodes 130b.

A string selection electrode 145 and a source selection electrode 155 may be formed above the semiconductor layer 100 on both outer sides of the upper and/or lower control gate electrodes 130a and 130b. In FIG. 1, the string selection electrode 145 and the source selection electrode 155 are formed above a first region 105 of the semiconductor layer 100 on both outer sides of the upper and/or lower control gate electrodes 130a and 130b. Gate insulation films 140 and 150 may be interposed between the string selection electrode 145 and the first region 105 and between the source selection electrode 155 and the first region 105, respectively.

Second regions 110 of the semiconductor layer 100 may be defined at portions of the semiconductor layer 100 on both sides of the string selection electrode 145 and the source selection electrode 155. Hereinafter, the second regions 110 are referred to as source and drain regions 110. For example, the one or more first regions 105 of the semiconductor layer 100 are doped with impurities of a first conduction type, and the source and drain regions 110 are doped with impurities of a second conduction type opposite to the first conduction type. For example, the first conduction type and the second conduction type may be one selected from an n-type and a p-type.

According to an example embodiment, the source and drain regions 110 are outside of the upper and lower control gate electrodes 130a and 130b. Stated differently, according to an example embodiment, the source and drain regions 110 are not formed at portions of the semiconductor layer 100 between the upper control gate electrodes 130a and between lower control gate electrodes 130b. Accordingly, the upper and lower control gate electrodes 130a and 130b may be disposed densely, thereby increasing the degree of integration of the non-volatile memory device shown in FIG. 1.

According to an example embodiment, the stacked structure of the first region 105 of the semiconductor layer 100 and the string selection electrode 145 and the stacked structure of the first region 105 of the semiconductor layer 100 and the source selection electrode 155 may form a structure of MOS transistors. The stacked structure of the first region 105 of the semiconductor layer 100 and the upper control gate electrodes 130a and the stacked structure of the first region 105 of the semiconductor layer 100 and the lower control gate electrodes 130b may form memory transistors. The first regions 105 of the semiconductor layer 100 may be used as a portion of a bit line, and the upper and lower control gate electrodes 130a and 130b may be used as a portion of a word line.

According to an example embodiment, two memory transistors may be disposed in the area of $4\ F^2$. Therefore, the non-volatile memory device may have a degree of integration about two times as large as a conventional memory device in which at most one memory transistor is disposed in the area of $4\ F^2$.

Figure 2:
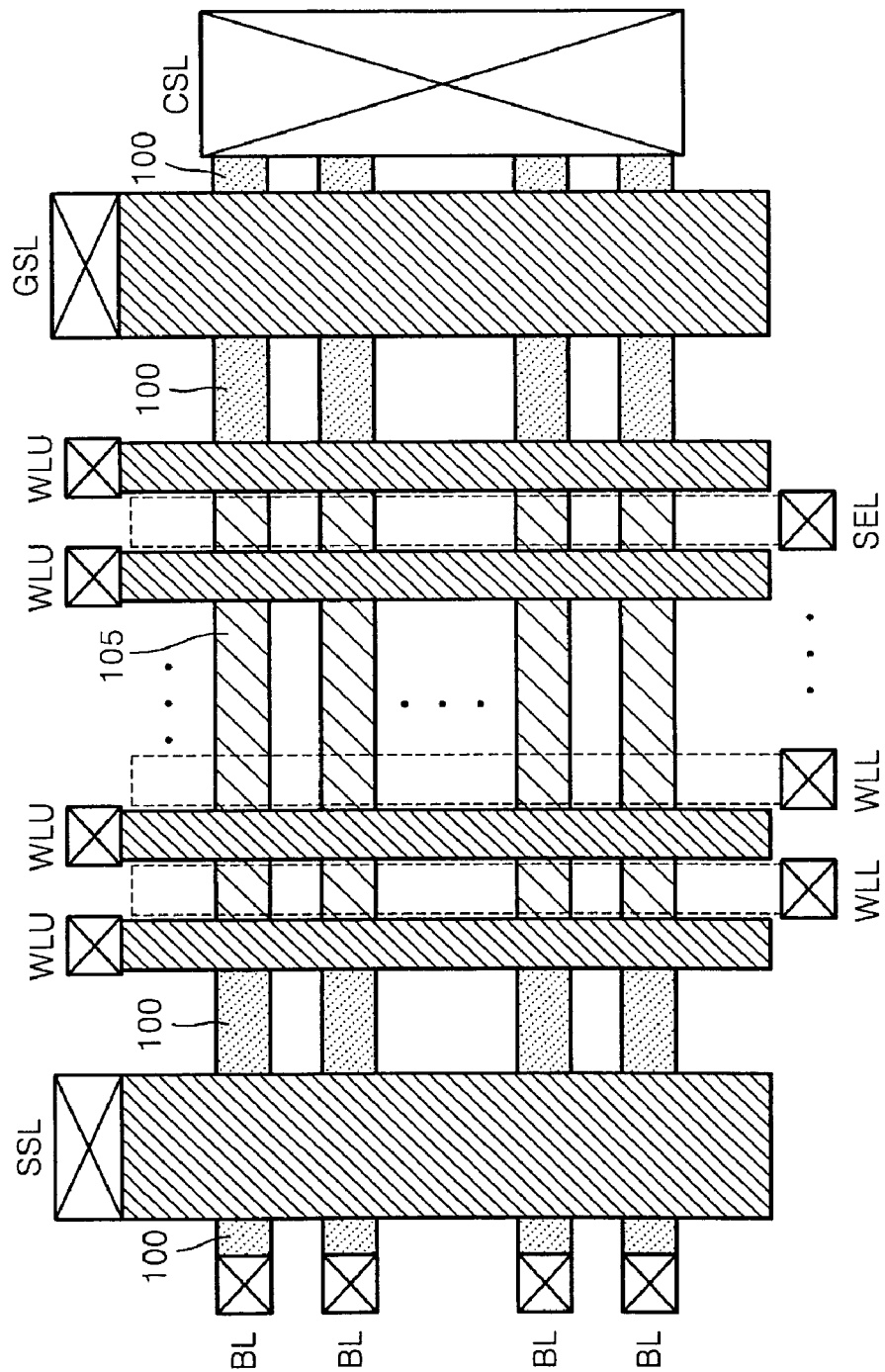
FIG. 2 is a plan view showing another example embodiment of a non-volatile memory device.

FIG. 2 is a plan view showing an example embodiment of a non-volatile memory device. The non-volatile memory device of FIG. 2 may be disposed in arrays by generalizing the non-volatile memory device of FIG. 1. For example, the non-volatile memory device of FIG. 1 may represent a cross-sectional structure of one string or bit line in the non-volatile memory device of FIG. 2. Therefore, a description of the components of the non-volatile memory device of FIG. 2, which are the same as components of the non-volatile memory device of FIG. 1 will not be repeated herein for the sake of brevity.

Referring to FIG. 2, a plurality of semiconductor layers 100 are arranged in rows. The first regions 105 of the semiconductor layers 100 may be used as a portion of bit lines BL. According to an example embodiment, one end of each of the semiconductor layers 100 may be connected to a common source line CSL. The common source line CSL may be connected to a first region 105 of the semiconductor layers 100. Another end of each of the semiconductor layers 100 may be connected to a power supply. The number of the semiconductor layers 100 may be selected according to the size of the memory block and does not limit the scope of the example embodiment. For example, the number of semiconductor layers 100 corresponds to the number bit lines BL in FIG. 2.

Referring back to FIG. 1, the stacked structure of the upper tunnelling insulation films 115a, the upper charge storage layers 120a, the upper blocking insulation films 125a, and the upper control gate electrodes 130a may be provided on first regions of the semiconductor layers 100. As shown in FIG. 1, the stacked structure of the lower tunnelling insulation films 115b, the lower blocking insulation films 125b, and the lower control gate electrodes 130b may be provided below the first regions 105 of the semiconductor layers 100. The string selection electrode 145 and the source selection electrode 155 may be also be provided on the first regions 105 of the semiconductor layers 100, as previously described with respect to FIG. 1. The source and drain regions 110 may be defined at portions of the semiconductor layers 100 on both sides of the string selection electrode 145 and the source selection electrode 155.

A plurality of upper word lines WLU may connect the upper control gate electrodes 130a disposed in the same column, and a plurality of lower word lines WLL may connect the lower control gate electrodes 130b arranged in a same column. Accordingly, the upper word lines WLU may be arranged above the semiconductor layer 105 and the lower word lines WLL may be arranged below the semiconductor layer 105. The number of the upper and lower word lines WLU and WLL may be selected according to the size of a memory block, for example. The number of upper and lower word lines WLU and WLL does not limit the scope of the example embodiment shown in FIG. 2.

Referring to FIG. 2, a string selection line SSL may connect string selection electrodes 145 arranged in a same column. A source selection line GSL may connect the source selection electrodes 155 arranged in a same column. The string erase line SEL may connect the string erase electrodes 135 arranged on first regions 105 of the semiconductor layers 100.

According to an example embodiment, the upper and lower control gate electrodes 130a and 130b may form some portions of the upper and lower word lines WLU and WLL. The string selection electrode 145 may form a portion of the string selection line SSL, and the source selection electrode 155 may form a portion of the source selection line GSL. The string erase electrode 135 may form a portion of the string erase line SEL. Therefore, one cross-section of the bit lines BL may be substantially similar to FIG. 1. However, a non-volatile memory device according to an example embodiment generalizes the numbers of the upper and lower word lines WLU and WLL.

Hereinafter, the operation of an example embodiment of a non-volatile memory device will be described in detail with respect to FIGS. 3-9.

Figure 3:
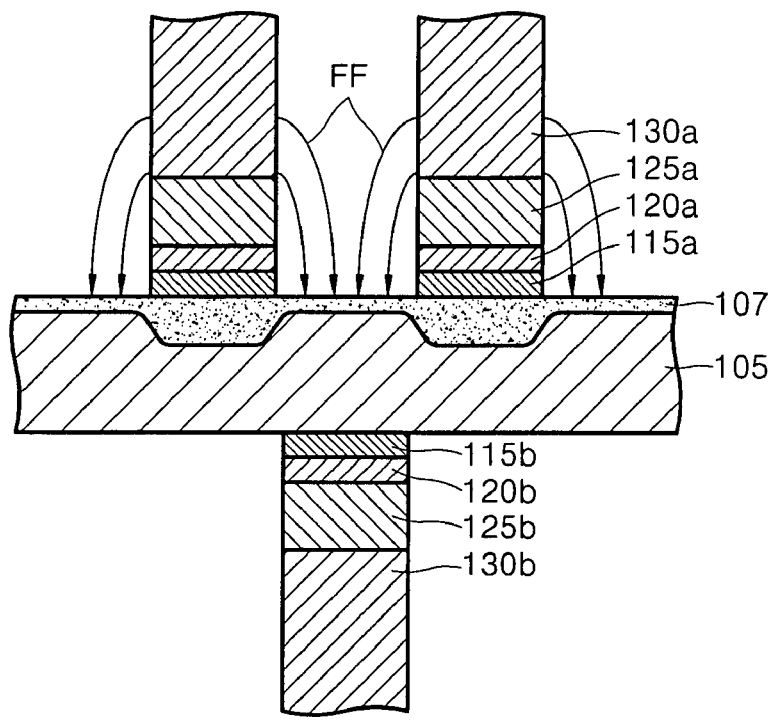
FIG. 3 is a partially enlarged cross-sectional view of the example embodiment of the non-volatile memory device of FIG. 1.

FIG. 3 is a partially enlarged cross-sectional view of the example embodiment of the non-volatile memory device of FIG. 1.

Referring to FIG. 3, a voltage of more than a pass voltage is applied to the upper control gate electrodes 130a, and a channel 107 is formed in the vicinity of the surface of the first region 105 of the semiconductor layer 100. The channel 107 may extend not only to the right lower side of the upper control gate electrodes 130a but to a portion of the semiconductor layer 105 between the upper control gate electrodes 130a. This is because a shallow channel 107 may be formed by a field in the side surface direction of the adjacent upper control gate electrodes 130a, e.g., by a fringe field FF.

Although there is not a source and drain region 110 in the interior of a memory transistor of a NAND structure according to an example embodiment, the channel 107 is connected to operate the non-volatile memory device. Because the size of the field in the side surface direction is limited, the separation distance D between the upper control gate electrodes 130a may be limited. Hereinafter, the operation method will be described in detail through distributions of potentials and current densities obtained by simulations.

Figure 4:
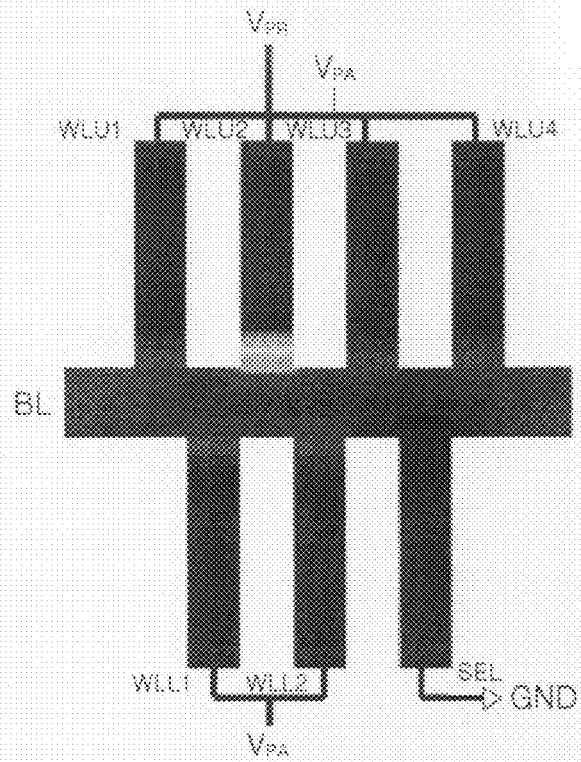
FIG. 4 is a cross-sectional view showing an example distribution of potentials obtained by simulations, which aid the explanation of a program operation of an example embodiment of a non-volatile memory device.

FIG. 4 is a cross-sectional view showing an example distribution of potentials obtained by simulations, which aid the explanation of a program operation of a non-volatile memory device according to an example embodiment. The non-volatile memory device of FIG. 4 diagrammatically shows some portions of the memory transistors of one bit line of the non-volatile memory device of FIG. 2 and therefore FIGS. 1 and 2 may be referred to during the explanation of the non-volatile memory device of FIG. 4.

Referring to FIG. 4, a program voltage $V_{PR}$ is applied by selecting the second upper word line WLU2 and the bit line BL is grounded. For example, the bit line BL may be maintained at 0 V by grounding the string erase line SEL. For example, a voltage allowing tunnelling of charges from the first region 105 of the semiconductor layer 100 to the upper charge storage layer 120a. Approximately 20 V may be selected as the program voltage $V_{PR}$, for example. The tunnelled charges may be maintained in the upper charge storage layer 120a before an erase operation.

A pass voltage $V_{PA}$ may be selectively applied to the upper and lower word lines WLU1, WLU3, WLU4, WLL1, and WLL2 which have not been selected. The pass voltage $V_{PA}$ may be selected as a voltage capable of forming the channel in the first region 105 of the semiconductor layer 105 as described with reference to FIG. 3. If the pass voltage $V_{PA}$ is applied, the memory transistors may be turned on. The channel may reduce and/or prevent mutual interference between the upper memory transistors and the lower memory transistors. For example, the operation of the upper memory transistor may be affected by the charge stored in the lower charge storage layers 120b of the lower memory transistor. However, the interference of the upper and lower memory transistors may be reduced and/or prevented by forming a channel in the vicinity of the surface of the first region 105 of the semiconductor layer 100.

In FIG. 4, the colors represent a distribution of voltages. For example, the voltages become smaller as the color goes from red to blue in FIG. 4. However, the distribution of the colors is merely an example and does not limit the scope of example embodiments.

The above-mentioned method of performing the programming operation by selecting the second upper word line WLU2 may be applied to other memory transistors. Moreover, the programming operation may performed by selecting a plurality of word lines. Therefore, the program operation may be performed by selecting at least one of the upper and lower word lines WLU1, WLU2, WLU3, WLU4, WLL1, WLL2, and WLL3.

Further, two bits of data may be stored in one upper or lower charge storage layer 120a and 120b using a multi-level cell (MLC) operation method. For example, the quantity of charges stored in the upper or lower charge storage layer 120a and 120b may be differentiated to form a four level data state including the states (1,1), (1,0), (0,0), and (0,1), for example. The state of (1,1) may represent an erase state and the state of (0,1) may represent a largely programmed state. Because the stored charge becomes larger as it goes from the state of (1,1) to the state of (0,1), the threshold voltage of the corresponding memory may increase.

According to an example embodiment, two most significant bits (MSB) may be stored in the upper memory transistor and two least significant bits (LSB) may be stored in the lower memory transistor. As such, four bits of data may be stored through the pair of adjacent upper and lower memory transistors. That is, four bits of data may be stored in the area of 4 $F^2$ and thus may realize the data processing of 1 bit/1 $F^2$, for example.

Figure 5:
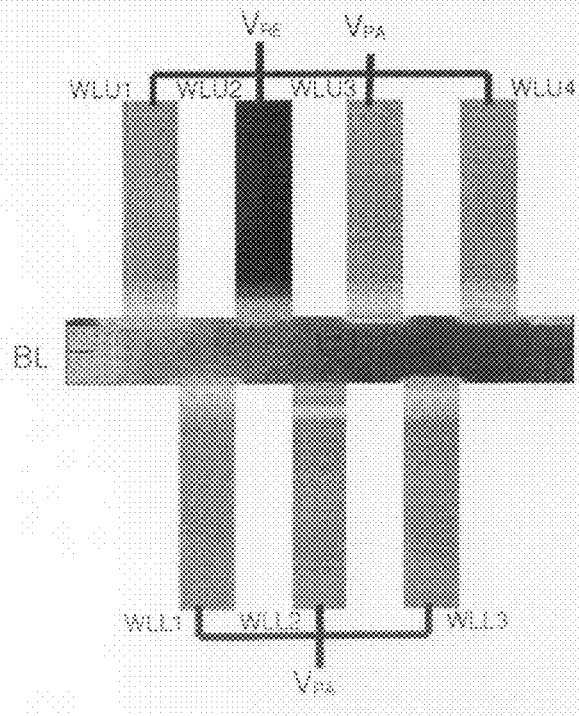
FIGS. 5 and 7 are cross-sectional views showing example distributions of potentials obtained by simulations, which aid the explanation of a read operation of an example embodiment of a non-volatile memory device.
Figure 6:
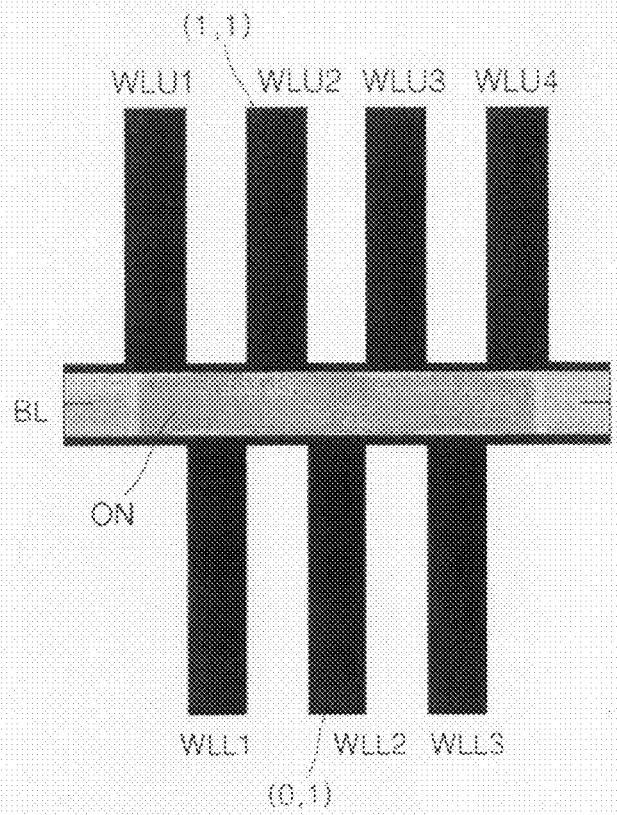
FIGS. 6 and 8 are cross-sectional views showing an example distribution of electron densities obtained by simulations, which aid the explanation of a read operation of an example embodiment of a non-volatile memory device.
Figure 7:
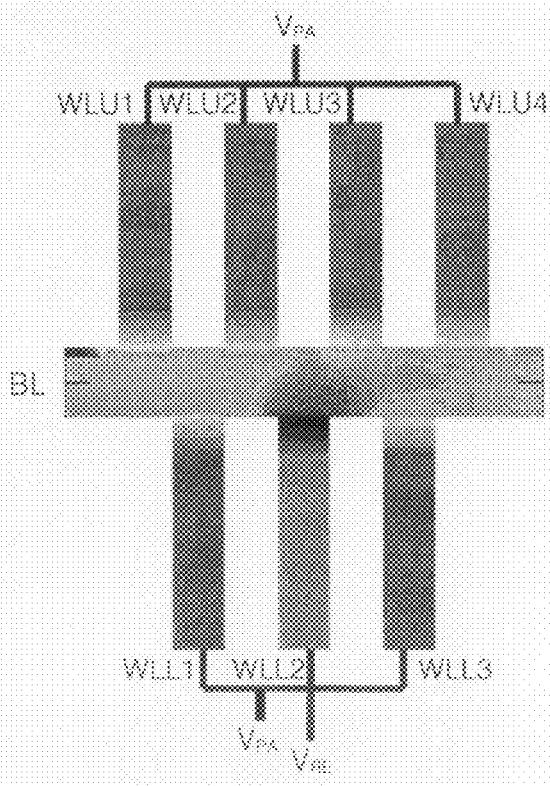
Figure 8:
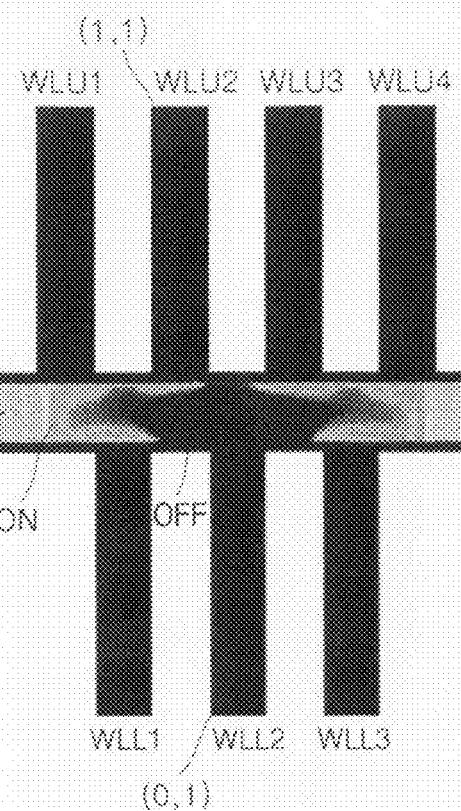

FIGS. 5 and 7 are cross-sectional views showing example distributions of potentials obtained by simulations, which aid the explanation of a read operation of an example embodiment of a non-volatile memory device. FIGS. 6 and 8 are cross-sectional views showing example distributions of electron densities obtained by simulations, which aid the explanation of the read operation of an example embodiment of a non-volatile memory device. The non-volatile memory device of FIGS. 5 to 8 diagrammatically shows some portions of the memory transistors of one bit line of the non-volatile memory device of FIG. 2. FIGS. 1 and 2 may be referred to during the description of FIGS. 5 to 8. However, FIGS. 5 to 8 further include a lower word line instead of a string erase line SEL and thus, are different from FIG. 4.

In FIGS. 5 to 8, the memory transistor including the second upper word line WLU2 is in the state of (1,1) and the memory transistor including the second lower word line WLL2 is in the state of (0,1). For example, FIGS. 5 and 6 represent an operation of reading the state of (1,1) and FIGS. 7 and 8 represent the operation of reading the state of (0,1). The colors in FIGS. 5 to 8 represent the distribution of voltages. For example, the voltages become lower as they go from the red color to the blue color. However, the distribution of the colors is merely an example and does not limit the scope of example embodiments.

Referring to FIG. 5, a read voltage $V_{RE}$ is applied to the selected second upper word line WLU2 and a pass voltage $V_{P4}$ is applied to the other word lines WLU1, WLU3, WLU4, WLL1, WLL2, and WLL3, which have not been selected. The read voltage $V_{RE}$ may be a voltage capable of turning on the memory transistor in the erase state, e.g., approximately 0 V, in order to differentiate the state of (1,1). A voltage may be applied to the bit line BL to measure the flow of current.

Referring to FIG. 6, it can be understood that a high current density region, i.e., a turn-on region ON, may allow current to flow in the direction of the bit line through the semiconductor layer 100. According to simulations, if a voltage of approximately 0.8 V is applied to the bit line BL, the flow of an on-current of approximately $10^{-5}$ A is expected through the bit line BL. Therefore, it is understood from the simulation result that the data state of the upper charge storage layer 120*a* below the second upper word line WLU2 is (1,1).

Moreover, from the simulation result, as described with reference to FIG. 3, it can be confirmed that the channel 107 may be formed in the first region 105 of the semiconductor layer 100 by a fringe field (FF).

Referring to FIG. 7, a read voltage $V_{RE}$ is applied to the selected second lower word line WLL2 and a pass voltage $V_{P4}$ is applied to the other word lines WLU1, WLU2, WLU3, WLU4, WLL1, and WLL3, which have not be selected. The read voltage may be a voltage capable of turning on the memory transistor in a programmed state, e.g., approximately 0 V, to distinguish the state of (0,1) from the state of (1,1). However, another read voltage may be selected to distinguish the state of (0,1) from the state of (1,0) or the state of (0,0). A voltage may be applied to the bit line BL so as to measure the flow of current.

Referring to FIG. 8, it is shown that a low current density region, i.e., a turn-off region OFF, interrupts a high current density region to interrupt the flow of current in the direction of the bit line BL. According to simulations, if a voltage of approximately 0.8 V is applied to the bit line BL, the flow of an off-current of approximately $10^{-11}$ A is expected through the bit line BL. From the result, it is shown that the data state of the lower charge storage layer 120*b* below the second lower word line WLL2 is (0,1).

The above mentioned read operation for the second upper word line WLU2 and the second lower word line WLL2 may be applied to other word lines. A read operation may be performed by selecting one from the upper and lower word lines WLU1, WLU2, WLU3, WLU4, WLL1, WLL2, and WLL3. Further, although the states of (1,1) and (0,1) have been exemplified until now, the above-mentioned description may be applied to the states of (1,0) and (0,0) by varying the read voltage $V_{RE}$.

Figure 9:
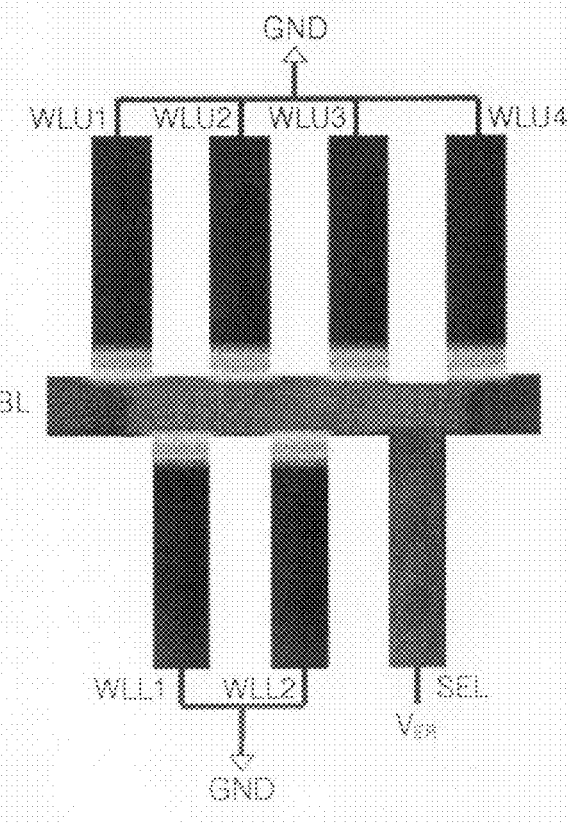
FIG. 9 is a cross-sectional view showing an example distribution of potentials obtained by simulations, which aid the explanation of an erase operation of an example embodiment of a non-volatile memory device.

FIG. 9 is a cross-section showing an example distribution of potentials obtained by simulations, which aid the explanation of an erase operation of an example embodiment of a non-volatile memory device. The non-volatile memory device of FIG. 9 diagrammatically shows some portions of the memory transistors of one bit line of the non-volatile memory device of FIG. 2 and therefore, FIGS. 1 and 2 may be referred to during the description of FIG. 9.

Referring to FIG. 9, the data stored in the upper and lower charge storage layers 120*a* and 120*b* may be erased substantially simultaneously by applying an erase voltage $V_{ER}$ to the string erase line SEL and grounding (GND) the upper and lower word lines WLU1, WLU2, WLU3, WLL1, and WLL2. For example, if the erase voltage $V_{ER}$ is a positive voltage, e.g., approximately 18 V, holes in the first region 105 of the semiconductor layer 100 may be coupled to electrons of the upper and lower charge storage layers 120*a* and 120*b*.

Example embodiments of non-volatile memory devices may have a degree of integration higher than the degree of integration of conventional non-volatile memory devices. For example, an example embodiment of the non-volatile memory device may have a degree of integration about two times as high as the degree of integration of a conventional non-volatile memory device at least in part because the upper control gate electrodes and the lower control gate electrodes on the opposite sides of the semiconductor layer are disposed alternately.

Moreover, in example embodiments of non-volatile memory devices, the source and drain regions may be omitted from the memory transistors, thereby increasing the degree of integration.

Further, data processing of 1 bit/1 $F^2$ may be realized by using an MLC operation method in an example embodiment of a non-volatile memory device.

While example embodiments have been particularly shown in the drawings and described above, it will be understood by those of ordinary skill in the art that various changes in form and details may be made therein without departing from the spirit and scope of this disclosure.

What is claimed is:
1. A non-volatile memory device comprising:
at least one semiconductor layer;
a plurality of upper control gate electrodes arranged above the at least one semiconductor layer;
a plurality of lower control gate electrodes arranged below the at least one semiconductor layer, the plurality of upper control gate electrodes and the plurality of lower control gate electrodes being disposed alternately;
a plurality of upper charge storage layers interposed between the at least one semiconductor layer and the upper control gate electrodes; and
a plurality of lower charge storage layers interposed between the at least one semiconductor layer and the lower control gate electrodes.

2. The non-volatile memory device of claim 1, further comprising:
at least one string erase electrode electrically connected to the at least one semiconductor layer.

3. The non-volatile memory device of claim 2, wherein the at least one string erase electrode is arranged on an outer side of one of the plurality of upper control gate electrodes and the plurality of lower control gate electrodes.

4. The non-volatile memory device of claim 1, further comprising:
at least one string selection electrode and at least one source selection electrode formed one of above and below the at least one semiconductor layer and arranged on both outer sides of the plurality of upper control gate electrodes and the plurality of lower control gate electrodes.

5. The non-volatile memory device of claim 4, further comprising:
at least one source and drain region defined in the at least one semiconductor layer on both sides of the at least one string selection electrode and the at least one source selection electrode.

6. The non-volatile memory device of claim 5, wherein the at least one source and drain region is defined at a portion of the at least one semiconductor layer on the outer side of the plurality of upper control gate electrodes and the plurality of lower control gate electrodes.

7. The non-volatile memory device of claim 5, wherein the at least one semiconductor layer is doped with impurities of a first conduction type and the at least one source and drain region is doped with impurities of a second conduction type opposite to the first conduction type.

8. The non-volatile memory device of claim 1, wherein widths of each of the plurality of upper control gate electrodes and each of the plurality of lower control gate electrodes are equal.

9. The non-volatile memory device of claim 1, wherein widths of each of the plurality of upper control gate electrodes and each of the plurality of lower control gate electrodes are equal to intervals between the upper control gate electrodes and the lower control gate electrodes.

10. The non-volatile memory device of claim 1, further comprising:
a plurality of upper tunneling insulation films interposed between the at least one semiconductor layer and the plurality of upper charge storage layers;
a plurality of lower tunneling insulation films interposed between the at least one semiconductor layer and the plurality of lower charge storage layers;
a plurality of upper blocking insulation films interposed between the plurality of upper charge storage layers and the plurality of upper control gate electrodes; and
a plurality of lower blocking insulation films interposed between the plurality of lower charge storage layers and the plurality of lower control gate electrodes.

11. The non-volatile memory device of claim 1, wherein the at least one semiconductor layer is used as a portion of at least one bit line and the plurality of upper control gate electrodes and the plurality of lower control gate electrodes are arranged in NAND structures.

12. The non-volatile memory device of claim 1, wherein the at least one semiconductor layer is a plurality of semiconductor layers arranged in rows;
the plurality of upper control gate electrodes are arranged in columns above the plurality of semiconductor layers;
the plurality of lower control gate electrodes are arranged in columns below the plurality of semiconductor layers, and the plurality of upper control gate electrodes and the plurality of lower control gate electrode are disposed alternately;
the plurality of upper charge storage layers are interposed between each of the plurality of semiconductor layers and the upper control gate electrodes; and
the plurality of lower charge storage layers are interposed between each of the plurality of semiconductor layers and the lower control gate electrodes.

13. The non-volatile memory device of claim 12, further comprising:
a plurality of upper word lines connecting the plurality of upper control gate electrodes arranged in a same row; and
a plurality of lower word lines connecting the plurality of lower control gate electrodes arranged in a same row.

14. The non-volatile memory device of claim 12, further comprising:
a plurality of string erase electrodes electrically connected to the plurality of semiconductor layers.

15. The non-volatile memory device of claim 14, further comprising:
a string erase line connecting the plurality of string erase electrodes.

16. The non-volatile memory device of claim 14, further comprising:
a common source line connecting ends of the plurality of semiconductor layers.

17. A method of operating the non-volatile memory device of claim 1, the method comprising:
selecting one of the plurality of upper and lower control gate electrodes for programming and programming data in one of the upper and lower charge storage layer corresponding to the one of the plurality of upper and lower control gate electrodes selected for programming by applying a program voltage to the selected one of the plurality of upper and lower control gate electrode; and
selecting one of the plurality of upper and lower control gate electrodes for reading and, reading the data from one of the upper and lower charge storage layer corresponding to the one of the plurality of upper and lower control gate electrodes selected for reading by applying a read voltage to the selected upper or lower control gate electrode.

18. The method of claim 17, further comprising:
applying a pass voltage to the plurality of upper and lower control gate electrodes not selected for programming during the programming of the data.

19. The method of claim 17, further comprising:
grounding a string erase electrode electrically connected to the semiconductor layer during the programming of the data.

20. The method of claim 17, further comprising:
applying a pass voltage to the plurality of upper and lower control gate electrodes not selected for reading during the reading of the data; and
measuring a current flowing through the semiconductor layer.

21. The method of claim 17, further comprising:
erasing data stored in the upper and lower charge storage layers substantially simultaneously by applying an erase voltage to a string erase electrode electrically connected to the semiconductor layer.

22. The method of claim 21, further comprising:
grounding the upper and lower control gate electrodes during the erasing.

* * * * *